United States Patent
Ono et al.

(10) Patent No.: US 10,333,084 B2
(45) Date of Patent: Jun. 25, 2019

(54) SEMICONDUCTOR FILM, OXIDE MICROPARTICLE DISPERSION, METHOD FOR MANUFACTURING SEMICONDUCTOR FILM, AND THIN FILM TRANSISTOR

(71) Applicant: FUJIFILM Corporation, Tokyo (JP)

(72) Inventors: Masashi Ono, Kanagawa (JP); Atsushi Tanaka, Kanagawa (JP); Masayuki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/058,336

(22) Filed: Mar. 2, 2016

(65) Prior Publication Data

US 2016/0190452 A1  Jun. 30, 2016

Related U.S. Application Data

(63) Continuation of application No. PCT/JP2014/070780, filed on Aug. 6, 2014.

(30) Foreign Application Priority Data

Sep. 30, 2013  (JP) .................................. 2013-205194

(51) Int. Cl.
 *H01L 51/00* (2006.01)
 *H01L 29/66* (2006.01)
 (Continued)

(52) U.S. Cl.
 CPC ...... *H01L 51/009* (2013.01); *H01L 29/66969* (2013.01); *H01L 29/7869* (2013.01);
 (Continued)

(58) Field of Classification Search
 CPC ............. H01L 51/0077; H01L 51/0079; H01L 51/0092; H01L 51/0003; H01L 51/0558;
 (Continued)

(56) References Cited

U.S. PATENT DOCUMENTS

2007/0051927 A1* 3/2007 Itoh ....................... B22F 1/0003
 252/500
2008/0242083 A1* 10/2008 Yoshizumi ............ H01L 27/101
 438/660
(Continued)

FOREIGN PATENT DOCUMENTS

JP  2005-272516 A  10/2005
JP  2008-130703 A  6/2008
 (Continued)

OTHER PUBLICATIONS

International Search Report for PCT/JP2014/070780 (PCT/ISA/210) dated Sep. 22, 2014.
(Continued)

*Primary Examiner* — Michele Fan
(74) *Attorney, Agent, or Firm* — Birch, Stewart, Kolasch & Birch, LLP

(57) ABSTRACT

There is provided a semiconductor film, including: an aggregate of oxide microparticles including at least one type of metal selected from the group consisting of In, Zn, and Sn; and at least one type of a ligand which is selected from the group consisting of a ligand expressed by General Formula (A) below, a ligand expressed by General Formula (B) below, and a ligand expressed by General Formula (C) below and which is coordinated with the oxide microparticles:

General Formula (A)

(Continued)

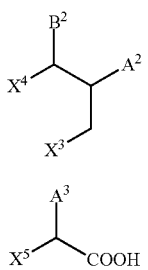

General Formula (B)

General Formula (C)

in which, in General Formula (A), each of $X^1$ and $X^2$ independently represents —SH, —NH$_2$, —OH, or —COOH, and each of $A^1$ and $B^1$ independently represents a hydrogen atom or a substituent having an atomic number of 1 to 10, in which, in General Formula (B), each of $X^3$ and $X^4$ independently represents —SH, —NH$_2$, —OH, or —COOH and each of $A^2$ and $B^2$ independently represents a hydrogen atom or a substituent having an atomic number of 1 to 10, and in which, in General Formula (C), $X^5$ represents —SH, —NH$_2$, or —OH, and $A^3$ represents a hydrogen atom or a substituent having an atomic number of 1 to 10.

17 Claims, 2 Drawing Sheets

(51) Int. Cl.
*H01L 29/786* (2006.01)
*H01L 51/05* (2006.01)
(52) U.S. Cl.
CPC ...... *H01L 51/0003* (2013.01); *H01L 51/0077* (2013.01); *H01L 51/0079* (2013.01); *H01L 51/0092* (2013.01); *H01L 51/0558* (2013.01); *H01L 51/0541* (2013.01); *H01L 51/0545* (2013.01)

(58) Field of Classification Search
CPC ............ H01L 29/7869; H01L 51/0545; H01L 51/0541
See application file for complete search history.

(56) References Cited

U.S. PATENT DOCUMENTS

2010/0081231 A1    4/2010  Hirata et al.
2015/0044361 A1*   2/2015  Subramanian ...... H01L 31/1884
                                                427/126.3

FOREIGN PATENT DOCUMENTS

| JP | 2008-270763 A | 11/2008 |
| JP | 2010-80689 A | 4/2010 |
| JP | 4738931 B2 | 8/2011 |
| JP | 2012-129411 A | 7/2012 |
| JP | 2013-112594 A | 6/2013 |
| WO | WO 2013170103 A1 * | 11/2013 ............ H01M 6/045 |

OTHER PUBLICATIONS

Luther et al., "Structural, Optical, and Electrical Properties of Self-Assembled Films of PbSe Nanocrystals Treated with 1,2-Ethanedithiol", American Chemical Society, vol. 2, No. 2, Jan. 31, 2008, pp. 271-280.
Written Opinion of the International Searching Authority for PCT/JP2014/070780 (PCT/ISA/237) dated Sep. 22, 2014.
Japanese Office Action, dated Jul. 5, 2016 for Japanese Patent Application No. 2013-205194, including a machine translation.
Japanese Decision of Refusal dated Jan. 10, 2017 for corresponding Japanese Application No. 2013-205194, including and English machine translation.
Japanese Office Action dated Aug. 29, 2017, for corresponding Japanese Application No. 2013-205194, with partial English translation.

* cited by examiner

SEMICONDUCTOR FILM, OXIDE MICROPARTICLE DISPERSION, METHOD FOR MANUFACTURING SEMICONDUCTOR FILM, AND THIN FILM TRANSISTOR

CROSS-REFERENCE TO RELATED APPLICATIONS

This application is a continuation application of International Application No. PCT/JP2014/070780, filed Aug. 6, 2014, the disclosure of which is incorporated herein by reference in its entirety. Further, this application claims priority from Japanese Patent Application No. 2013-205194, filed Sep. 30, 2013, the disclosure of which is incorporated herein by reference in its entirety.

BACKGROUND OF THE INVENTION

1. Field of the Invention

The present invention relates to a semiconductor film, an oxide microparticle dispersion liquid, a method for manufacturing a semiconductor film, and a thin film transistor.

2. Description of the Related Art

A transparent oxide semiconductor (TOS) which is transparent, has high mobility, and has excellent manufacturing suitability attracts attention, and thus a transparent oxide semiconductor reaches a level of a practical application as an active layer of an oxide thin film transistor (TOS-TFT) in some cases. An active layer in TOS-TFT which is practically applied now is manufactured by a vacuum film deposition method. However, since a manufacturing cost easily increases in a case of the vacuum film deposition method, research of aiming at the realization of TOS exhibiting excellent characteristics by a solution applying process is vigorously conducted in some cases.

As a method using such a solution as a raw material, a method of applying a solution raw material including metal alkoxide, an inorganic metal salt, or the like, applying some energy, forming a network of metal and oxygen, and converting a solution with the network into an oxide semiconductor and a method of dispersing oxide semiconductor microparticles in which a network of metal and oxygen are formed in advance in a solution and applying this solution so as to obtain a TOS film consisting of an aggregate of microparticles are considered.

For example, it is reported that electroconductivity is enhanced by substituting a ligand molecule bonded to a quantum dot (for example, in the range of 2 nm to 10 nm) with a shorter ligand molecule (for example, "Structural, Optical, and Electrical Properties of Self-Assembled Films of PbSe Nanocrystals Treated with 1,2-Ethanedithiol" ACS Nano (2008) written by J. M. Luther, et al.).

In addition, a method of forming an oxide semiconductor thin film by using a nanoparticle dispersion liquid including metal oxide nanoparticles which are selected from the compound including special metal and which have an average particle size of 50 nm or less and a dispersion medium is disclosed (for example, see JP4738931B).

In addition, a technique of forming a microparticle layer by applying a dispersion liquid in which microparticles are dispersed to a substrate is disclosed (for example, see JP2010-80689A, JP2013-112594A, and JP2008-130703A).

SUMMARY OF THE INVENTION

However, in "Structural, Optical, and Electrical Properties of Self-Assembled Films of PbSe Nanocrystals Treated with 1,2-Ethanedithiol" ACS Nano (2008) written by J. M. Luther, et al. or JP2010-80689A, the semiconductor film does not include oxide microparticles, and if all manufacturing steps are not performed under the inert atmosphere, the characteristics are greatly deteriorated. In addition, since the semiconductor film is not transparent, the characteristics are greatly deteriorated by photoirradiation.

In addition, JP4738931B discloses that oxide nanoparticles for realizing TOS, but a dispersant (ligand) having an alkyl group with a relatively long chain is used in order to apply dispersion properties, and JP2013-112594A or JP2008-130703A disclose that a dispersant (ligand) having an alkyl group with a relatively long chain is used in order to apply dispersion properties. In the case of the TOS film which is formed by applying the oxide nanoparticles, there is a case where electroconductivity through particles may not be obtained sufficiently.

In addition, in order to enhance electroconductivity, a method of applying a mixture liquid obtained by mixing semiconductor microparticles in a solvent without using a dispersant is considered, but particles are easily condensed with each other and sufficient film flatness may not obtained.

In view of the above, an object of the invention is to provide a semiconductor film that can be manufactured in the atmosphere and that can obtain high electroconductivity, and a method for manufacturing a semiconductor film, and the invention is intended to achieve the object.

In addition, an object of the invention is to provide an oxide microparticle dispersion liquid for manufacturing a semiconductor film that can be manufactured in the atmosphere and that can obtain high electroconductivity, and the invention is intended to achieve the object.

Further, an object of the invention is to provide a thin film transistor that can be manufactured in the atmosphere and that can obtain high mobility, and the invention is intended to achieve the object.

In order to solve the objects described above, the invention is provided as below.

<1> A semiconductor film, including:

an aggregate of oxide microparticles including at least one type of metal selected from the group consisting of In, Zn, and Sn; and at least one type of a ligand which is selected from the group consisting of a ligand expressed by General Formula (A) below, a ligand expressed by General Formula (B) below, and a ligand expressed by General Formula (C) below and which is coordinated with the oxide microparticles.

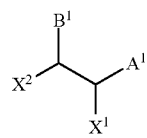

General Formula (A)

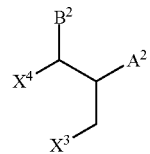

General Formula (B)

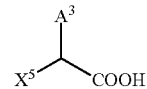

General Formula (C)

[In General Formula (A), each of $X^1$ and $X^2$ independently represents —SH, —NH$_2$, —OH, or —COOH, and each of $A^1$ and $B^1$ independently represents a hydrogen atom or a substituent having from 1 to 10 atoms.

In General Formula (B), each of $X^3$ and $X^4$ independently represents —SH, —NH$_2$, —OH, or —COOH and each of $A^2$ and $B^2$ independently represents a hydrogen atom or a substituent having from 1 to 10 atoms.

In General Formula (C), $X^5$ represents —SH, —NH$_2$, or —OH, and $A^3$ represents a hydrogen atom or a substituent having from 1 to 10 atoms.]

<2> The semiconductor film according to <1>, in which the oxide microparticles include at least In.

<3> The semiconductor film according to <1> or <2>, in which an average particle diameter of the oxide microparticles is 3 nm to 30 nm.

<4> The semiconductor film according to any one of <1> to <3>, in which each of the $A^1$, the $B^1$, the $A^2$, the $B^2$, and the $A^3$ represents a hydrogen atom.

<5> The semiconductor film according to any one of <1> to <4>, in which each of the $X^2$ and the $X^4$ represents —SH or —NH$_2$.

<6> The semiconductor film according to any one of <1> to <5>, in which the at least one type of the ligand is selected from the group consisting of ethanedithiol, ethylenediamine, mercaptopropionic acid, glycolic acid, 2-aminoethanethiol, 2-aminoethanol, 3-amino-1-propanol, 3-mercapto-1-propanol, and thioglycolic acid, and derivatives of the ligands.

<7> An oxide microparticle dispersion liquid including:
oxide microparticles including at least one type of metal selected from the group consisting of In, Zn, and Sn;
at least one type of a ligand which is selected from the group consisting of a ligand expressed by General Formula (A) below, a ligand expressed by General Formula (B) below, and a ligand expressed by General Formula (C) below and which is coordinated with the oxide microparticles; and
an organic solvent.

In General Formula (C), $X^5$ represents —SH, —NH$_2$, or —OH, and $A^3$ represents a hydrogen atom or a substituent having from 1 to 10 atoms.]

<8> The oxide microparticle dispersion liquid according to <7>, in which the oxide microparticles include at least In.

<9> The oxide microparticle dispersion liquid according to <7> or <8>, in which an average particle diameter of the oxide microparticles is 3 nm to 30 nm.

<10> The oxide microparticle dispersion liquid according to any one of <7> to <9>, in which each of the $A^1$, the $B^1$, the $A^2$, the $B^2$, and the $A^3$ represents a hydrogen atom.

<11> The oxide microparticle dispersion liquid according to any one of <7> to <10>, in which each of the $X^2$ and the $X^4$ represents —SH or —NH$_2$.

<12> The oxide microparticle dispersion liquid according to any one of <7> to <11>, in which the at least one type of the ligand is selected from the group consisting of ethanedithiol, ethylenediamine, mercaptopropionic acid, glycolic acid, 2-aminoethanethiol, 2-aminoethanol, 3-amino-1-propanol, 3-mercapto-1-propanol, and thioglycolic acid, and derivatives of the ligands.

<13> A method for manufacturing a semiconductor film, including:
an oxide microparticle aggregate forming step of applying an oxide microparticle dispersion liquid containing oxide microparticles including at least one type of metal which is selected from the group consisting of In, Zn, and Sn, a first ligand coordinated with the oxide microparticles, and a first solvent, to a substrate so as to form an aggregate of the oxide microparticles; and
a ligand exchanging step of applying a solution containing a second ligand which has a shorter molecular chain length than the first ligand and which is at least one type selected from the group consisting of a ligand expressed by General Formula (A) below, a ligand expressed by General Formula (B) below, and a ligand expressed by General Formula (C) below, and a second solvent, to an aggregate of the oxide microparticles so as to exchange the first ligand coordinated with the oxide microparticles into the second ligand.

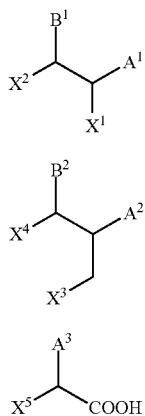

General Formula (A)

General Formula (B)

General Formula (C)

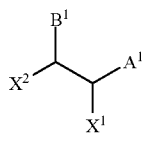

General Formula (A)

General Formula (B)

General Formula (C)

[In General Formula (A), each of $X^1$ and $X^2$ independently represents —SH, —NH$_2$, —OH, or —COOH, and each of $A^1$ and $B^1$ independently represents a hydrogen atom or a substituent having from 1 to 10 atoms.

In General Formula (B), each of $X^3$ and $X^4$ independently represents —SH, —NH$_2$, —OH, or —COOH and each of $A^2$ and $B^2$ independently represents a hydrogen atom or a substituent having from 1 to 10 atoms.

[In General Formula (A), each of $X^1$ and $X^2$ independently represents —SH, —NH$_2$, —OH, or —COOH, and each of $A^1$ and $B^1$ independently represents a hydrogen atom or a substituent having from 1 to 10 atoms.

In General Formula (B), each of $X^3$ and $X^4$ independently represents —SH, —NH$_2$, —OH, or —COOH and each of $A^2$ and $B^2$ independently represents a hydrogen atom or a substituent having from 1 to 10 atoms.

In General Formula (C), $X^5$ represents —SH, —NH$_2$, or —OH, and $A^3$ represents a hydrogen atom or a substituent having from 1 to 10 atoms.]

<14> The method for manufacturing a semiconductor film according to <13>, in which the oxide microparticles include at least In.

<15> The method for manufacturing a semiconductor film according to <13> or <14>, in which an average particle diameter of the oxide microparticles is 3 nm to 30 nm.

<16> The method for manufacturing a semiconductor film according to any one of <13> to <15>, in which each of the $A^1$, the $B^1$, the $A^2$, the $B^2$, and the $A^3$ represents a hydrogen atom.

<17> The method for manufacturing a semiconductor film according to any one of <13> to <16>, in which each of the $X^2$ and the $X^4$ represents —SH or —NH$_2$.

<18> The method for manufacturing a semiconductor film according to any one of <13> to <17>, in which the at least one type of the ligand is selected from the group consisting of ethanedithiol, ethylenediamine, mercaptopropionic acid, glycolic acid, 2-aminoethanethiol, 2-aminoethanol, 3-amino-1-propanol, 3-mercapto-1-propanol, and thioglycolic acid, and derivatives of the ligands.

<19> A thin film transistor including: the semiconductor film according to any one of <1> to <6>.

The invention provides a semiconductor film that can be manufactured in the atmosphere and that can obtain high electroconductivity, and a method for manufacturing the semiconductor film.

In addition, an object of the invention is to provide an oxide microparticle dispersion liquid for manufacturing a semiconductor film that can be manufactured in the atmosphere and that can obtain high electroconductivity.

Further, an object of the invention is to provide a thin film transistor that can be manufactured in the atmosphere and that can obtain high mobility.

DESCRIPTION OF THE PREFERRED EMBODIMENTS

Figure 1A:
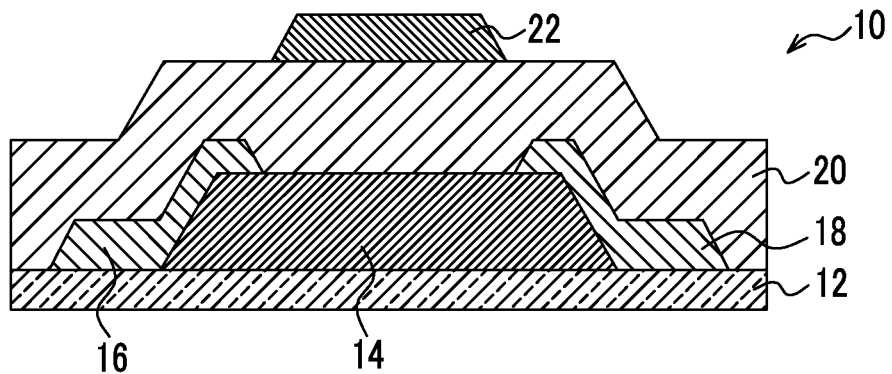
FIG. 1A is a diagram schematically illustrating a thin film transistor (TFT) according to an embodiment of the invention, which is an example of a top contact-type TFT in a top gate structure.

Hereinafter, the semiconductor film and the method for manufacturing the semiconductor film according to the invention are described in detail.

<Semiconductor Film>

The semiconductor film according to the invention has an aggregate of oxide microparticles including at least one type of metal selected from the group consisting of In, Zn, and Sn and at least one type of a ligand which is selected from the group consisting of a ligand expressed by General Formula (A) below, a ligand expressed by General Formula (B) below, and a ligand expressed by General Formula (C) below and which is coordinated with the oxide microparticles.

Hereinafter, "at least one type of a ligand which is selected from the group consisting of a ligand expressed by General Formula (A) below, a ligand expressed by General Formula (B) below, and a ligand expressed by General Formula (C) below" is referred to as a "special ligand".

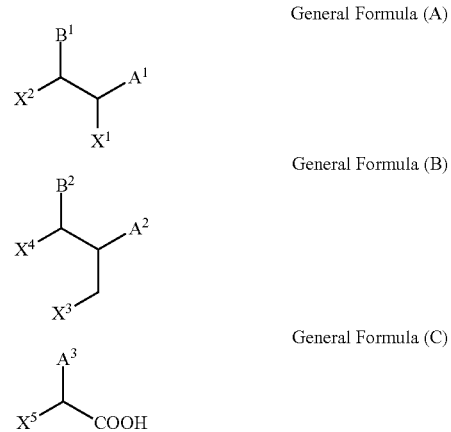

General Formula (A)

General Formula (B)

General Formula (C)

In General Formula (A), each of $X^1$ and $X^2$ independently represents —SH, —NH$_2$, —OH, or —COOH, and each of $A^1$ and $B^1$ independently represents a hydrogen atom or a substituent having from 1 to 10 atoms.

In General Formula (B), each of $X^3$ and $X^4$ independently represents —SH, —NH$_2$, —OH, or —COOH, each of $A^2$ and $B^2$ independently represents a hydrogen atom or a substituent having from 1 to 10 atoms.

In General Formula (C), $X^5$ represents —SH, —NH$_2$, or —OH, $A^3$ represents a hydrogen atom or a substituent having from 1 to 10 atoms.

In addition, the ligand expressed by General Formula (A), the ligand expressed by General Formula (B), and the ligand expressed by General Formula (C) are different ligands.

The oxide microparticles are particles having a particle diameter in a nanosize of several nanometers to several tens of nanometers.

In the semiconductor film according to the invention, an interval between oxide microparticles becomes short due to a coordinate bond of a special ligand which is expressed by General Formula (A), (B), or (C) and has a small number of atoms to oxide microparticles. Therefore, oxide microparticles are closely arranged, and the overlapping of wavefunctions between oxide microparticles can be strengthened. As a result, it is considered that electroconductivity becomes high.

In addition, if oxide microparticles are used, a semiconductor film for which all manufacturing steps do not have to be performed under the inert atmosphere and in which high characteristics are exhibited can be obtained without deteriorating the characteristics even in the atmosphere, compared with a case where oxide microparticles are not used as microparticles for forming the semiconductor film.

In addition, since a network of metal and oxygen is formed in advance, energy applying step (for example, a UV treatment) for forming a network of metal and oxygen is not required, and high characteristics can be obtained.

Further, the special ligand has at least two of —SH, —NH$_2$, —OH, and OH of a carboxy group, in a molecule. It is considered that —SH, —NH$_2$, —OH, or OH of a carboxy group has a high complex stability constant and promotes the forming of a complex with a metal atom of oxide microparticles and —SH, —NH$_2$, —OH, or OH of a carboxy group. In addition, all or a portion of the special ligand coordinated on the surface of the oxide microparticle can be coordinated in a form of an interparticle crosslink across plural oxide microparticles, and thus the connection between oxide microparticles and the special ligand becomes strong. Therefore, it is considered that the peeling of the semiconductor film formed to include oxide microparticles and the special ligand is prevented.

Complex Stability Constant

It is preferable that a complex stability constant log $\beta_1$ between the special ligand and the metal atom of oxide microparticles in the semiconductor film according to the invention is 8 or greater.

Here, the complex stability constant is a constant determined by a function of a ligand and a metal atom that becomes a target of a coordinate bond and is expressed by Formula (b) below.

$$\log\beta_1 = \frac{[ML]}{[M][L]} \quad \text{Formula (b)}$$

In Formula (b), [ML] represents mol concentration of a complex obtained by bonding a metal atom and a ligand, [M] represents mol concentration of a metal atom that can contribute to a coordinate bond, and [L] represents mol concentration of a ligand.

In practice, there is a case where plural ligands may be coordinated with one metal atom. However, according to the invention, the complex stability constant log $\beta_1$ expressed by Formula (b) in case one ligand molecule is coordinated with one metal atom is defined as an index of strength of a coordinate bond.

If the complex stability constant log $\beta_1$ between the special ligand and the metal atom of the oxide microparticle is 8 or greater, a complex is easily formed.

The complex stability constant log $\beta_1$ is desirably higher than that of the combination between the oxide microparticle and the ligand. In addition, if the ligand is a polydentate ligand such as chelate, bonding strength can be increased. In general, if the strength of the coordinate bond is high, a long molecule chain ligand in the related art is effectively substituted, and thus higher electroconductivity is easily obtained. In addition, the value of the complex stability constant log $\beta_1$ of the special ligand changes by changing an oxide microparticle material for forming the oxide microparticles. However, the special ligand has a short molecular chain length and is easily coordinated, and thus can be applied to various oxide microparticle materials.

Log $\beta_1$ is preferably 8 or greater and more preferably 10 or greater.

Examples of a method of obtaining the complex stability constant log $\beta_1$ between the special ligand and the metal atom of the oxide microparticles in the semiconductor film according to the invention include spectroscopy, magnetic resonance spectroscopy, potentiometry, solubility measurement, chromatography, calorimetry, freezing point measurement, vapor pressure measurement, relaxation measurement, viscosity measurement, and surface tension measurement.

A complex stability constant is determined by using Sc-Database ver. 5.85 (Academic Software) (2010) in which various methods and research results are gathered. In case log $\beta_1$ is not in Sc-Databese ver. 5.85, values disclosed in Critical Stability Constants written by A. E. Martell and R. M. Smith are used. In case log $\beta_1$ is not disclosed in Critical Stability Constants, either, log $\beta_1$ is calculated by using the measurement methods described above or using a program PKAS method (The Determination and Use of Stability Constants, VCH (1988) written by A. E. Martell, et al.) for calculating a complex stability constant.

Hereinafter, details of the special ligand and oxide microparticles for forming the semiconductor film according to the invention are described.

First, details of the special ligand are described.

[At Least One Type of Ligand (Special Ligand) Selected from the Group Consisting of the Ligand Expressed by General Formula (A), the Ligand Expressed by General Formula (B), and the Ligand Expressed by General Formula (C)]

The semiconductor film according to the invention includes at least one type of the special ligands.

The semiconductor film according to the invention may include 2 or more special ligands. That is, all of the coordinate bonds in the aggregate of the oxide microparticles included in the semiconductor film according to the invention may be bonds by one type of the special ligands or one portion of the coordinate bonds may be bonds by the special ligand expressed by General Formula (A) and the other portion of the coordinate bonds may be bonds by the special ligand expressed by General Formula (B).

In case $A^1$ and $B^1$ in General Formula (A), $A^2$ and $B^2$ in General Formula (B), and $A^3$ in General Formula (C) represent substituents having from 1 to 10atoms, examples of the substituent having from 1 to 10 atoms include an alkyl group having 1 to 3 carbon atoms [a methyl group, an ethyl group, a propyl group, and an isopropyl group], an alkenyl group having 2 to 3 carbon atoms [an ethenyl group, a propenyl group, and the like], an alkynyl group having 2 to 4 carbon atoms [an ethynyl group, a propynyl group, and the like], a cyclopropyl group, an alkoxy group having 1 to 2 carbon atoms [a methoxy group and an ethoxy group], an acyl group having 2 to 3 carbon atoms [an acetyl group, and a propionyl group], an alkoxycarbonyl group having 2 to 3 carbon atoms [a methoxycarbonyl group and an ethoxycarbonyl group], an acyloxy group having 2 carbon atoms [an acetyloxy group], an acylamino group having 2 carbon atoms [an acetylamino group], a hydroxyalkyl group having 1 to 3 carbon atoms [a hydroxymethyl group, a hydroxyethyl group, and a hydroxypropyl group], an aldehyde group [—COH], a hydroxy group [—OH], a carboxy group [—COOH], a sulfo group [—SO$_3$H], a phospho group [—OPO(OH)$_2$], an amino group [—NH$_2$], a carbamoyl group [—CONH$_2$], a cyano group [—CN], an isocyanate group [—N=C=O], a thiol group [—SH], a nitro group [—NO$_2$], a nitroxy group [—ONO$_2$], an isothiocyanate group [—NCS], a cyanate group [—OCN], a thiocyanate group [—SCN], an acetoxy group [OCOCH$_3$], an acetamide group [NHCOCH$_3$], a formyl group [—CHO], a formyloxy group [—OCHO], a formamide group [—NHCHO], a sulfamino group [—NHSO$_3$H], a sulfino group [—SO$_2$H], a sulfamoyl group [—SO$_2$NH$_2$], a phosphono group [—PO$_3$H$_2$], an acetyl group [—COCH$_3$], a halogen atom [a fluorine atom, a chlorine atom, a bromine atom, and the like], an alkalimetal atom [a lithium atom, a sodium atom, a potassium atom, and the like With respect to the substituent, if a total number of atoms is 10 or less, substituents may be further included.

If the number of atoms of the substituent is 10 or less, the steric hindrance due to the ligand is prevented such that the oxide microparticles can be brought close to each other. Therefore, electroconductivity of the semiconductor film can be enhanced.

In view of reducing a distance between oxide microparticles, the substituent preferably has 7 or less atoms.

Further, in view of shortening the molecular chain length of the ligand and causing particles to strongly come close to each other, $A^1, B^1, A^2, B^2$, and $A^3$ are more preferably hydrogen atoms.

In view of solubility when the special ligand is caused to be an alcohol solution, $X^1$ in General Formula (A) and $X^3$ in General Formula (B) are preferably —OH (hydroxy groups).

Since coordination force is strong and the generation of a dangling bond on the particle surface is easily prevented, each of $X^2$ in General Formula (A) and $X^4$ in General Formula (B) is preferably —SH (a thiol group) or —NH$_2$ (an amino group).

Specific examples of the compound expressed by General Formula (A), General Formula (B), or General Formula (C) include ethanedithiol, ethylenediamine, mercaptopropionic acid, glycolic acid, 2-aminoethanethiol, 2-aminoethanol, 3-amino-1-propanol, 3-mercapto-1-propanol, and thioglycolic acid.

In addition, the special ligand may be a derivative of a compound expressed by General Formula (A), a derivative of a compound expressed by General Formula (B), or a derivative of a compound expressed by General Formula (C), such as an ethanedithiol derivative, an ethylenediamine derivative, a mercaptopropionic acid derivative, a glycolic acid derivative, a 2-aminoethanethiol derivative, a 2-aminoethanol derivative, a 3-amino-1-propanol derivative, a 3-mercapto-1-propanol derivative, and a thioglycolic acid derivative.

In the case of these ligands, higher electroconductivity and field effect mobility are easily exhibited.

[Aggregate of Oxide Microparticles Including at Least One Metal Selected from the Group Consisting of in, Zn, and Sn]

The semiconductor film according to the invention has an aggregate of oxide microparticles. In addition, the oxide microparticles have at least one type of metal selected from the group consisting of In, Zn, and Sn.

The aggregate of the oxide microparticles refers to a form in which multiple (for example, 100 or more per 1 μm$^2$ square) oxide microparticles are arranged close to each other.

In addition, the "semiconductor" according to the invention means a semiconductor having a specific resistance value of 10$^{-2}$ Ωcm to 10$^8$ Ωcm.

The oxide microparticles include at least one type of metal of In, Sn, and Zn, desirably oxide microparticles including at least In, and preferably oxide microparticles containing Sn, Ga, and Zn in a certain ratio (including a case where Sn, Ga, and Zn are not contained). This is because higher electron mobility is expected in the case of oxide where a peripheral electron orbit of In is 5 S, and In is used as a base material. In addition, in case the oxide crystal using In as a base material is caused to contain Sn, the carrier concentration can be expected to increase. Meanwhile, in case the oxide crystal using In as a base material is caused to contain Ga, an oxygen deficit can be prevented, and carrier concentration can be reduced without greatly decreasing electron mobility. In addition, in case the oxide crystal using In as a base material is caused to contain Zn, the increase of the carrier concentration and the increase of the electron mobility can be expected.

In addition, it is possible to manufacture a semiconductor film which is transparent and stable to the photoirradiation by using oxide microparticles having a wide band gap. Therefore, it is desirable that the band gap is 3 eV or less.

Specifically, as the oxide microparticles, InO, InGaO, InZnO, InSnO, InGaZnO, and InZnSnO are more desirable.

Further, as the oxide microparticles, only metal selected from the group consisting of In, Zn, and Sn is preferably contained as metal.

The average particle diameter of the oxide microparticles is desirably 3 nm to 30 nm. Further, the average particle diameter is more desirably 3 nm to 20 nm and still more desirably 3 nm to 10 nm.

If the average particle diameter is 3 nm or greater, the movement of the electron is prevented from being restricted by particle boundary, such that high electroconductivity can be obtained. In addition, increase of an effective band gap by a quantum size effect is prevented, such that high electroconductivity can be obtained. Meanwhile, if an average particle diameter is 30 nm or less, a semiconductor film having favorable roughness can be easily realized.

In addition, an average particle diameter of the oxide microparticles refers to an average particle diameter of ten oxide microparticles and represents a number average particle diameter. In the measurement of the particle diameter of the oxide microparticles, a transmission electron microscope may be used.

In the aggregate of the oxide microparticles in the semiconductor film according to the invention, an interparticle average minimum distance is preferably less than 0.80 nm.

In the film having the aggregate of the oxide microparticles, if the interparticle average minimum distance of the oxide microparticles is great, electroconductivity decreases and the film becomes an insulator. Electroconductivity is enhanced by reducing the interparticle average minimum distance of the oxide microparticles.

The semiconductor film has a form of including an aggregate of oxide microparticles and at least one type of the ligand which is coordinated with oxide microparticles and which is selected from the group consisting of the ligand expressed by General Formula (A), the ligand expressed by General Formula (B), and the ligand expressed by General Formula (C) such that the interparticle average minimum distance can be caused to be less than 0.80 nm.

Here, the interparticle average minimum distance of the oxide microparticles refers to an average value of minimum distances (interparticle minimum distance) between the surface of an oxide microparticle A and the surface of an oxide microparticle B that is adjacent to the oxide microparticle A. Specifically, the interparticle minimum distance is calculated in the following method.

The interparticle minimum distance of the oxide microparticles can be obtained by structure evaluation of the semiconductor film having the aggregate of the oxide microparticles in grazing incidence small angle X-ray scattering (GISAXS). In the measurement, a distance d between centers of adjacent oxide microparticles is obtained, and the interparticle minimum distance are calculated by subtracting the particle diameter of the oxide microparticle from the distance d between the centers.

If structure evaluation of the semiconductor film is performed in the measurement apparatus of GISAXS, an average of scattered X rays with respect to the oxide microparticles existing in all the areas which are irradiated with X rays become scattered X rays of a measurement target. The interparticle minimum distance calculated based on the detected scattered X rays is the "interparticle average minimum distance" which is the average value of the respective interparticle minimum distances.

The interparticle average minimum distance of the oxide microparticles is more preferably less than 0.65 nm and still more preferably less than 0.50 nm.

The thickness of the semiconductor film is not particularly limited. However, in view of obtaining high electroconductivity, the thickness is preferably 10 nm or greater and more preferably 50 nm or greater. In addition, since there is a concern in that the carrier concentration may become excessive, and the semiconductor film can be caused to be easily manufactured, the thickness of the semiconductor film is preferably 300 nm or less.

The method for manufacturing the semiconductor film according to the invention is not particularly limited. However, since the interval between the oxide microparticles are reduced, and oxide microparticles are closely arranged, it is preferable to manufacture the semiconductor film in the method for manufacturing the semiconductor film according to the invention.

<Method for Manufacturing Semiconductor Film (First Aspect)>

The method for manufacturing the semiconductor film according to the invention includes a oxide microparticle aggregate forming step of applying an oxide microparticle dispersion liquid containing oxide microparticles, a first ligand coordinated with the oxide microparticles, and a first solvent, to a substrate, and forming an aggregate of the oxide microparticles, and a ligand exchanging step of applying a second ligand which has a shorter molecular chain length than the first ligand and which is at least one selected from the ligand expressed by General Formula (A), the ligand expressed by General Formula (B), and the ligand expressed by General Formula (C), and a solution (ligand solution) containing a second solvent, to an aggregate of oxide microparticles and exchanging the first ligand coordinated with the oxide microparticles to the second ligand.

In the method for manufacturing the semiconductor film according to the invention, the oxide microparticle aggregate forming step and the ligand exchanging step may be repeated, or a dispersion liquid drying step of drying an oxide microparticle dispersion liquid, a solution drying step of drying a ligand solution, a washing step of washing an oxide microparticle aggregate on the substrate, or the like may be further included.

In the method for manufacturing the semiconductor film according to the invention, an aggregate of the oxide microparticles is formed on the substrate by applying the oxide microparticle dispersion liquid to the substrate in the oxide microparticle aggregate forming step. At this point, since the oxide microparticles are dispersed in the first solvent by the first ligand having a longer molecular chain length than the second ligand, the oxide microparticles are not likely to have a condensed bulk shape. Accordingly, the aggregate of the oxide microparticles can have a configuration in which oxide microparticles are arranged one by one by applying the oxide microparticle dispersion liquid to the substrate.

Subsequently, ligand exchanging between the first ligand coordinated with the oxide microparticles and the second ligand (special ligand) having a shorter molecular chain length than the first ligand can be performed by applying the solution of the special ligand to the aggregate of the oxide microparticles in the ligand exchanging step. It is considered that the special ligand has at least two of —SH, —NH$_2$, —OH, and OH of a carboxy group in a molecule as expressed by General Formulae (A) to (C) and promotes the forming of a complex with a metal atom of oxide microparticles and —SH, —NH$_2$, —OH, or OH of a carboxy group. Accordingly, it is considered that, since the second ligand (special ligand) is coordinated by being substituted with the first ligand having a longer molecular chain length than the second ligand, oxide microparticles are easily brought close to each other. It is considered that the electroconductivity of the aggregate of the oxide microparticles can be increased by bring oxide microparticles close to each other.

Further, it is considered that, in case oxide microparticles are connected to each other by a coordinate bond through a special ligand, the aggregate of oxide microparticles becomes a strong semiconductor film, and thus the semiconductor film is not likely to be peeled off.

[Oxide Microparticle Aggregate Forming Step]

In the oxide microparticle aggregate forming step, the aggregate of the oxide microparticles is formed by applying the oxide microparticle dispersion liquid containing the oxide microparticles, the first ligand coordinated with the oxide microparticles, and the first solvent to the substrate.

The oxide microparticle dispersion liquid may be applied on the substrate surface or may be applied on another layer provided on the substrate.

Examples of the other layer provided on the substrate include an adhesive layer for enhancing adhesiveness between the substrate and the aggregate of the oxide microparticles, the transparent conductive layer, and the like.

—Oxide Microparticle Dispersion Liquid—

The oxide microparticle dispersion liquid contains oxide microparticles including at least one type of metal selected from the group consisting of In, Zn, and Sn, the first ligand, and the first solvent.

The oxide microparticle dispersion liquid may contain other components without deteriorating the effect of the invention.

(Oxide Microparticles)

Details of the oxide microparticles which is contained in the oxide microparticle dispersion liquid and which include at least one type of metal selected from the group consisting of In, Zn, and Sn are as described above, and a preferable aspect thereof is the same.

In addition, the content of the oxide microparticles in the oxide microparticle dispersion liquid is preferably 1 mg/ml to 100 mg/ml and more preferably 5 mg/ml to 40 mg/ml.

If the content of the oxide microparticles in the oxide microparticle dispersion liquid is 1 mg/ml or greater, the density of the oxide microparticles on the substrate increases, and a favorable film is easily obtained. Meanwhile, if the content of the oxide microparticles is 100 mg/ml or less, the film thickness of the film obtained when the oxide microparticle dispersion liquid is applied once is not likely to be thickened. Therefore, the ligand exchange of the first ligand coordinated with the oxide microparticles in the film can be sufficiently performed.

(First Ligand)

The first ligand contained in the oxide microparticle dispersion liquid functions as the ligand coordinated with the oxide microparticles and also has the molecule structure that easily causes steric hindrance, and thus accomplishes a role as a dispersant for dispersing the oxide microparticles in the first solvent. Here, the dispersion refers to a state in which there is no precipitation of particles or no impurity.

The first ligand has a longer molecular chain length than the second ligand described below. The length of the molecular chain length is determined by the length of the main chain in case the molecule has a branched structure. The ligand expressed by General Formula (A), the ligand expressed by General Formula (B), and the ligand expressed by General Formula (C), which are the second ligand are not correspond to the first ligand.

In view of enhancing the dispersion of the oxide microparticles, the first ligand is a ligand in which the number of carbon atoms of the main chain is desirably 6 or more and the number of carbon atoms of the main chain is more desirably 10 or more.

Specifically, the first ligand may be any one of a saturated compound and an unsaturated compound, and examples thereof include a decanoic acid, a lauric acid, a myristic acid, a palmitic acid, a stearic acid, a behenic acid, an oleic acid, an erucic acid, oleylamine, dodecylamine, dodecanethiol, 1,2-hexadecanethiol, trioctylphosphine, trioctylphosphine oxide, and cetrimonium bromide.

It is preferable that the first ligand is not likely to remain in a film at the time of forming the semiconductor film.

Among these, the first ligand is preferably at least one of an oleic acid and oleylamine, in view of causing the oxide microparticles to have dispersion stability and not being likely to remain in a semiconductor film.

The content of the first ligand in the oxide microparticle dispersion liquid is desirably 10 mmol/l to 200 mmol/l with respect to the total volume of the oxide microparticle dispersion liquid.

(First Solvent)

The first solvent contained in the oxide microparticle dispersion liquid is not particularly limited, but the first solvent is preferably a solvent that is not likely to dissolve the oxide microparticles and easily dissolve the first ligand. The first solvent is preferably an organic dissolving agent, and specific examples thereof include alkane [n-hexane, n-octane, and the like], benzene, and toluene.

The first solvent may be used singly, or may be a mixture solvent in which two or more types thereof are mixed.

Among these, the first solvent is preferably a solvent that is not likely to be remained in the formed semiconductor film. If the first solvent is a solvent having relatively lower boiling point, a content of a remaining organic product can be suppressed when a semiconductor film is finally obtained.

Further, a solvent having good wettability to the substrate is preferable. For example, in case a solvent is applied to a glass substrate, alkane such as hexane and octane is more preferable.

The content of the first solvent in the oxide microparticle dispersion liquid is preferably 90 mass % to 98 mass % with respect to the total mass of the oxide microparticle dispersion liquid.

—Substrate—

The oxide microparticle dispersion liquid is applied to the substrate.

The shape, the structure, and the size of the substrate are not particularly limited, and can be selected appropriately. The structure of the substrate may be a single structure or may be a laminate structure. As the substrate, for example, a substrate formed of an inorganic material such as glass, and yttria-stabilized zirconia (YSZ), a resin, and a resin composite material can be used. Among these, a substrate formed of a resin or a resin composite material is preferable, in view of light weight and flexibility.

Examples of the resin include polybutylene terephthalate, polyethylene terephthalate, polyethylene naphthalate, polybutylene naphthalate, polystyrene, polycarbonate, polysulfone, polyethersulfone, polyarylate, allyl diglycol carbonate, polyamide, polyimide, polyamideimide, polyetherimide, polybenzazole, polyphenylene sulfide, polycycloolefin, norbonene resin, a fluorine resin such as polychlorotrifluoroethylene, a liquid crystal polymer, acrylic resin, epoxy resin, silicone resin, ionomer resin, cyanate resin, crosslinked fumaric acid diester, cyclic polyolefin, aromatic ether, maleimide olefin, cellulose, and a synthetic resin such as an episulphide compound.

Examples of the inorganic material and the composite material of the resin include composite plastic materials of resins and inorganic materials as below. That is, examples thereof include a composite plastic material of a resin and a silicon oxide particle, a composite plastic material of a resin and a metal nanoparticles, a composite plastic material of a resin and an inorganic oxide nanoparticle, a composite plastic material of a resin and an inorganic nitride nanoparticle, a composite plastic material of a resin and a carbon fiber, a composite plastic material of a resin and a carbon nanotube, a composite plastic material of a resin and a glass flake, a composite plastic material of a resin and a glass fiber, a composite plastic material of a resin and a glass bead, a composite plastic material of a resin and clay mineral, a composite plastic material of a resin and a particle having a mica derived crystal structure, a laminated plastic material having at least one time of a bond interface between a resin and thin glass, and a composite material having barrier characteristics including at least one or more times of the bond interface by alternately layering an inorganic layer and an organic layer.

An aluminum substrate with an oxide film and the like of which insulation properties of the surface are enhanced by performing an oxidation treatment (for example, an anodic oxidation treatment) on a stainless steel substrate, a metal multilayer substrate obtained by laminating stainless steel and a different type of metal, an aluminum substrate, or a surface thereof may be used.

In addition, it is preferable that the substrate (the resin substrate or the resin composite material substrate) formed from the resin or the resin composite material is a substrate which is excellent in heat resistance, dimensional stability, solvent resistance, electrical insulation, workability, low gas permeability, and low moisture absorption. The resin substrate and the resin composite material substrate may have a gas barrier layer for preventing permeation of moisture, oxygen, and the like, an undercoat layer for enhancing flatness of the resin substrate or adhesiveness with a lower electrode, and the like.

In addition, a lower electrode, an insulation film, and the like may be included in the substrate. In this case, the lower electrode is applied on the substrate or the oxide microparticle dispersion liquid is applied on the insulation film.

The thickness of the substrate is not particularly limited, but the thickness thereof is preferably 50 μm to 1,000 μm and more preferably 50 μm to 500 μm. If the thickness of the substrate is 50 μm or greater, the flatness of the substrate itself is enhanced. If the thickness of the substrate is 1,000 μm or less, the flexibility of the substrate itself is enhanced, and the semiconductor film is easily used as a flexible semiconductor device.

The method of applying the oxide microparticle dispersion liquid on the substrate is not particularly limited, and examples thereof include a method of applying the oxide microparticle dispersion liquid on the substrate and a method of immersing the substrate in the oxide microparticle dispersion liquid.

A method of applying the oxide microparticle dispersion liquid on the substrate, more specifically, a liquid phase method such as a spin coating method, a dipping method, an inkjet method, a dispenser method, a screen printing method, a letter press printing method, an intaglio printing method, and a spray coating method can be used.

Particularly, in an ink-jet method, a dispenser method, a screen printing method, a letter press printing method, and an intaglio printing method, a coating layer can be formed in an arbitrary position on the substrate. Since a patterning step after film forming is not required, a process cost can be reduced.

[Ligand Exchanging Step]

In the ligand exchanging step, in the oxide microparticle aggregate forming step, a solution (ligand solution) containing the second ligand which has a shorter molecular chain length than the first ligand and which is at least one type selected from the group consisting of the ligand expressed by General Formula (A), the ligand expressed by General Formula (B), and the ligand expressed by General Formula (C) and the second solvent are applied to the aggregate of the oxide microparticles formed on the substrate, and the first ligand coordinated with the oxide microparticles is exchanged with the second ligand (special ligand) contained in the ligand solution.

—Ligand Solution—

The ligand solution at least contains the second ligand (the special ligand) and the second solvent.

The ligand solution may further have another component without deteriorating the effect of the invention.

(Second Ligand)

The second ligand is the special ligand described above and has the shorter molecular chain length than the first ligand. The method of determining the length of the molecular chain length of the ligand is as described in the description of the first ligand.

In addition, the details of the special ligand are also as described above.

In addition, in case alcohol is used as the second solvent contained in the ligand solution, it is preferable that the hydroxy group (OH) is included in the molecule. If the special ligand has a hydroxy group in the molecule structure, miscibility with alcohol can be increased. In addition, in case the ligand of the oxide microparticles is exchanged by the ligand solution containing the special ligand having the hydroxy group, if alcohol is used as the second solvent, the ligand exchange can be more effectively performed.

The content of the special ligand in the ligand solution is preferably 5 mmol/1 to 200 mmol/1 and more preferably 10 mmol to 100 mmol/1 with respect to the total volume of the ligand solution.

(Second Solvent)

The second solvent contained in the ligand solution is not particularly limited, but it is preferable that the second solvent is a solvent that easily dissolves the special ligand.

As the solvent, an organic solvent having high permittivity is preferable, and examples thereof include ethanol, acetone, methanol, acetonitrile, dimethylformamide, dimethylsulfoxide, butanol, and propanol.

The second solvent may be one type and may be a mixture solvent in which 2 or more types are mixed.

Among the above, the second solvent is preferably a solvent that is not likely to remain in the formed semiconductor film. In view of being easily dried and easily removed by washing, alkane and alcohol having a low boiling point are preferably, and methanol, ethanol, n-hexane, or n-octane is more preferable.

In addition, the content of the second solvent in the ligand solution is a remnant obtained by subtracting the content of the special ligand from the total mass of the ligand solution.

The method of applying the ligand solution to the aggregate of the oxide microparticles is the same as the method of applying the oxide microparticle dispersion liquid on the substrate, and the preferable aspect is also the same.

The oxide microparticle aggregate forming step and the ligand exchanging step may be repeated. If the oxide microparticle aggregate forming step and the ligand exchanging step are repeated, electroconductivity of the semiconductor film having the aggregate of the oxide microparticles coordinated with the special ligand is increased, such that the thickness of the semiconductor film can be thickened.

The repeat of the oxide microparticle aggregate forming step and the ligand exchanging step may be performed by repeating respective steps independently. However, it is preferable to repeat a cycle of performing the oxide microparticle aggregate forming step and the ligand exchanging step. Unevenness of the ligand exchange can be easily prevented by repeating a set of the oxide microparticle aggregate forming step and the ligand exchanging step.

In addition, in case the oxide microparticle aggregate forming step and the ligand exchanging step are repeated, it is preferable to sufficiently dry the film per cycle.

As an exchanging rate to the special ligand in the ligand exchange of the oxide microparticle aggregate is higher, it is expected that the electroconductivity of the semiconductor film increases.

In addition, it is sufficient that the ligand exchange between the first ligand and the second ligand (special ligand) of the oxide microparticles is performed in at least a portion of the oxide microparticle aggregate, and 100% (the number) of the the special ligands do not have to be substituted.

(Washing Step)

Further, the method for manufacturing the semiconductor film according to the invention may have a washing step for washing the oxide microparticle aggregate on the substrate.

An excessive ligand and a ligand separated from the oxide microparticles can be removed by having the washing step. In addition, the remaining solvent and other impurities can be removed. The washing of the oxide microparticle aggregate may be performed by injecting at least one of the first solvent and the second solvent on the aggregate of the oxide microparticles or by immersing the substrate on which the oxide microparticle aggregate or the semiconductor film is formed in at least one of the first solvent and the second solvent.

The washing of the washing step may be performed after the oxide microparticle aggregate forming step or may be performed after the ligand exchanging step. In addition, the washing may be performed after the repeat of the set of the oxide microparticle aggregate forming step and the ligand exchanging step.

(Drying Step)

The method for manufacturing the semiconductor film according to the invention may have a drying step.

The drying step may be the dispersion liquid drying step of drying the solvent remained in the oxide microparticle aggregate after the oxide microparticle aggregate forming step or may be the solution drying step of drying the ligand solution after the ligand exchanging step. In addition, the drying step may be a comprehensive step which is performed after the repeat of the set of the oxide microparticle aggregate forming step and the ligand exchanging step.

The semiconductor film is manufactured on the substrate by performing the respective steps as described above.

Since the shorter special ligand than that in the related art is bonded to the oxide microparticles in the obtained semiconductor film, electroconductivity increases. In addition, since the special ligand has a high complex stability constant, a coordinate bond is stable, film strength is excellent, and peeling is suppressed in the semiconductor film according to the invention which is formed by the oxide microparticles and the special ligand.

<Another Method for Manufacturing Semiconductor Film (Second Aspect)>

In addition, the semiconductor film according to the invention may be manufactured by applying the oxide microparticle dispersion liquid containing the oxide microparticles including at least one metal selected from the group consisting of In, Zn, and Sn, a ligand which is coordinated with the oxide microparticles and which is at least one ligand selected from the group consisting of the ligand expressed by General Formula (A), the group consisting of the ligand expressed by General Formula (B), and the group consisting of the ligand expressed by General Formula (C), and an organic solvent, to the substrate and forming the aggregate of the oxide microparticles.

Further, in a method for manufacturing a semiconductor film according to a second aspect, the forming of the aggregate of the oxide microparticles may be repeated, and the method may further have the dispersion liquid film drying step drying the oxide microparticle dispersion liquid film, the washing step of washing the oxide microparticle aggregate on the substrate, and the like.

—Oxide Microparticle Dispersion Liquid According to Second Aspect—

The oxide microparticle dispersion liquid according to the second aspect contains oxide microparticles including at least one type selected from the group consisting of In, Zn, and Sn, a ligand which is coordinated with the oxide microparticles and which is at least one ligand selected from the group consisting of the ligand expressed by General Formula (A), the ligand expressed by General Formula (B), and the ligand expressed by General Formula (C), and the organic solvent.

The oxide microparticle dispersion liquid according to the second aspect may contain still another component, without deteriorating the effect of the invention.

Further, the oxide microparticle dispersion liquid according to the second aspect can be manufactured, for example, as follows.

First, oxide microparticles including at least one type of metal selected from the group consisting of In, Zn, and Sn, a first ligand coordinated with the oxide microparticles, and a dispersion liquid 1 which is dispersed in a solvent 1 are prepared. Here, the first ligand is a ligand for applying sufficient dispersion properties to the solvent 1, examples thereof include first ligands exemplified in the manufacturing method according to the first aspect described above, and the preferable aspect is also the same.

Subsequently, a solution 2 (a ligand solution) obtained by dissolving a second ligand (a special ligand) in a solvent 2 is prepared. Further, the second ligand indicates the special ligand described above.

In addition, as the solvent 2, a solvent which is not miscible with the solvent 1 is used.

Here, examples of the solvent 1 include a nonpolar solvent such as octane, hexane, and toluene, and examples of the solvent 2 include a polar solvent such as water, formamide, and N-methylformamide.

Subsequently, the dispersion liquid 1 and the solution 2 (ligand solution) are mixed and stirred. At this point, stirring is performed such that the both are sufficiently mixed temporarily. Here, in case the second ligand (the special ligand) is substituted with the first ligand coordinated with the oxide microparticles in advance, a portion of the oxide microparticles in the dispersion liquid 1 of the oxide microparticles is transferred to the solution 2. Here, the oxide microparticle dispersion liquid in which the second ligand (the special ligand) is modified can be obtained by removing the solvent 1 (at this point, remaining oxide microparticles and the like are also included in the solvent 1) including the first ligand separated from the surfaces of the oxide microparticles.

Further, as the manufacturing method according to the second aspect, methods exemplified as the manufacturing method according to the first aspect described above is used as the substrate. In addition, the washing step or the drying step also can be performed in the methods described in the manufacturing method according to the first aspect described above.

<Electronic Device>

The use of the semiconductor film according to the invention is not limited, but the semiconductor film according to the invention can be very appropriately applied for various electronic devices having semiconductor films.

Specifically, the semiconductor film according to the invention can be appropriately applied to the semiconductor layer (active layer) of the thin film transistor.

(Thin Film Transistor)

The thin film transistor (hereinafter, referred to as TFT) according to the embodiment of the invention is an active element having a gate electrode, a gate insulation film, an active layer, a source electrode, and a drain electrode, and having a function of applying a voltage to the gate electrode, controlling an electronic current flowing to the active layer, and switching an electronic current between the source electrode and the drain electrode. Also, in the thin film transistor according to the embodiment of the invention, the semiconductor film described above is used as at least one of the active layer, an insulation layer (a gate insulation film or a protection layer), and a conductive layer (a gate electrode, a source electrode, a drain electrode, or the like).

The element structure of the TFT may be any one aspect of a so-called inverse stagger structure (also referred to as a bottom gate type) and a stagger structure (also referred to as a top gate type), based on the position of the gate electrode. In addition, element structure of the TFT may be any one aspect of the so-called top contact type and the so-called bottom contact type, based on the contact portion of the active layer with the source electrode and the drain electrode (appropriately referred to as "source-drain electrodes".).

In addition, the top gate type refers to an embodiment in which in case a substrate for forming TFT is an undermost layer, a gate electrode is disposed on the upper side of the gate insulation film, and an active layer is formed on the lower side of the gate insulation film. The bottom gate type refers to an embodiment in which the gate electrode is disposed on the lower side of the gate insulation film, and the active layer is formed on the upper side of the gate insulation film. In addition, the bottom contact type refers to an embodiment in which the source-drain electrodes are formed before the active layer, and the lower surface of the active layer comes into contact with the source-drain electrodes. The top contact type refers to an embodiment in which the active layer is formed before the source-drain electrodes, and the upper surface of the active layer comes into contact with the source-drain electrodes.

FIG. 1A is a diagram schematically illustrating a TFT according to the embodiment of the invention, which is an example of a top contact-type TFT in a top gate structure. In a TFT 10 illustrated in FIG. 1A, an active layer 14 is laminated on the principal surface on one side of a substrate 12. Also, a source electrode 16 and a drain electrode 18 are provided on the active layer 14 in a manner of being separated from each other, and further a gate insulation film 20 and a gate electrode 22 are further laminated in this sequence.

Figure 1B:
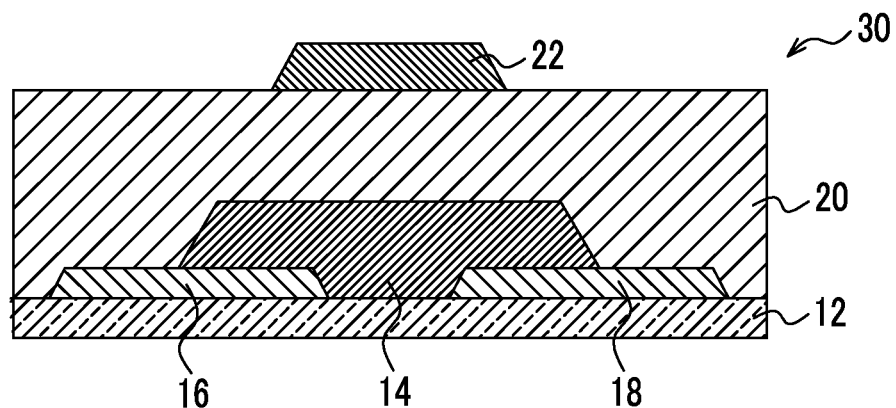
FIG. 1B is a diagram schematically illustrating a TFT according to the embodiment of the invention, which is an example of a bottom contact-type TFT in a top gate structure.

FIG. 1B is a diagram schematically illustrating a TFT according to the embodiment of the invention, which is an example of a bottom contact-type TFT in a top gate structure. In a TFT 30 illustrated in FIG. 1B, the source electrode 16 and the drain electrode 18 are provided on the principal surface on one side of the substrate 12 in a manner of being separated from each other. Also, the active layer 14, the gate insulation film 20, and the gate electrode 22 are sequentially laminated.

Figure 1C:
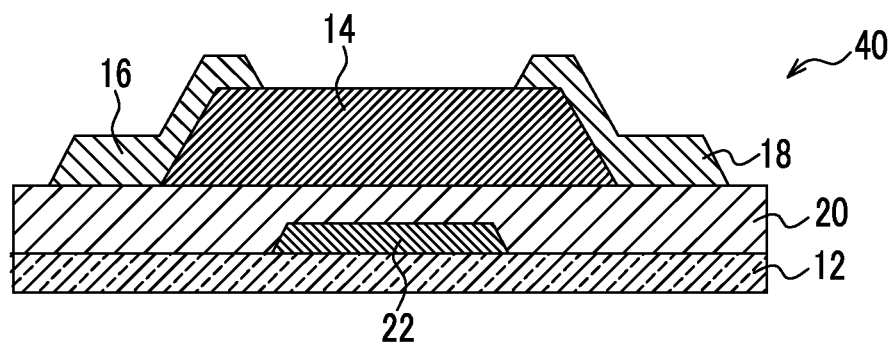
FIG. 1C is a diagram schematically illustrating a TFT according to the embodiment of the invention, which is an example of a top contact-type TFT in a bottom gate structure.

FIG. 1C is a diagram schematically illustrating a TFT according to the embodiment of the invention, which is an example of a top contact-type TFT in a bottom gate structure. In a TFT 40 illustrated in FIG. 1C, the gate electrode 22, the gate insulation film 20, and the active layer 14 are sequentially laminated on the principal surface on one side of the substrate 12. Also, the source electrode 16 and the drain electrode 18 are provided on the surface of the active layer 14 in a manner of being separated from each other.

Figure 1D:
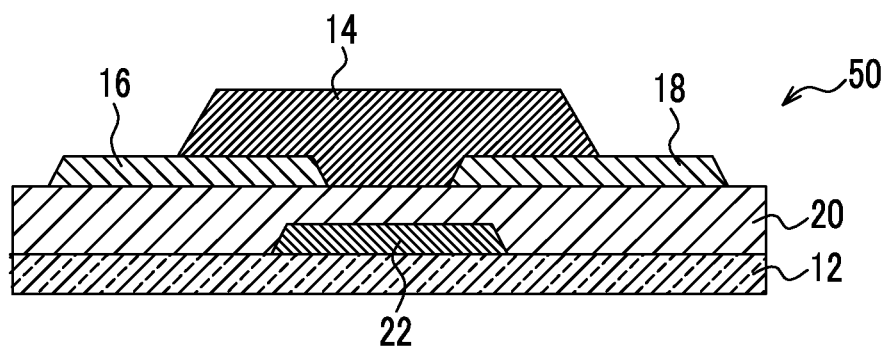
FIG. 1D is a diagram schematically illustrating a TFT according to the embodiment of the invention, which is an example of a bottom contact-type TFT in a bottom gate structure.

FIG. 1D is a diagram schematically illustrating a TFT according to the invention, which is an example of a bottom contact-type TFT in a bottom gate structure. In a TFT 50 illustrated in FIG. 1D, the gate electrode 22 and the gate insulation film 20 are sequentially laminated on the principal surface on one side of the substrate 12. Also, the source electrode 16 and the drain electrode 18 are provided on the surface of the gate insulation film 20 in a manner of being separated from each other, and the active layer 14 is laminated thereon.

Also, in addition to the above, the TFT according to the embodiment may have various configurations, and may have a configuration of having a protection layer on the active layer or an insulation layer on the substrate.

Hereinafter, respective components are described. In addition, as a representative example, a case of using the semiconductor film according to the embodiment which is the top contact-type TFT 10 in the top gate structure illustrated in FIG. 1A as the active layer 14 is described in detail, but the invention can be applied in the same manner in case a TFT according to another embodiment is manufactured.

(Detailed Configuration of TFT)

—Substrate—

First, the substrate 12 for forming the TFT 10 is prepared.

The shape, the structure, the size, and the like of the substrate 12 are not particularly limited, and can be appropriately selected according to the purpose. The structure of the substrate 12 may be a single layer structure or a laminate structure.

The material of the substrate 12 is not particularly limited, and an inorganic substrate such as glass or yttria-stabilized zirconia (YSZ), a resin substrate, a composite material thereof, or the like can be used. Among these, in view of light weight and flexibility, a resin substrate or a composite material thereof is preferable. Specific examples thereof include a synthetic resin substrate formed of polybutylene terephthalate, polyethylene terephthalate, polyethylene naphthalate, polybutylene naphthalate, polystyrene, polycarbonate, polysulfone, polyethersulfone, polyarylate, allyl diglycol carbonate, polyamide, polyimide, polyamideimide, polyetherimide, polybenzazole, polyphenylene sulfide, polycycloolefin, a norbonene resin, a fluorine resin such as polychlorotrifluoroethylene, a liquid crystal polymer, an acrylic resin, an epoxy resin, a silicone resin, an ionomer resin, a cyanate resin, crosslinked fumaric acid diester, cyclic polyolefin, aromatic ether, maleimide olefin, cellulose, or a synthetic resin such as an episulphide compound, a composite plastic material of a synthetic resin and silicon oxide particles, a composite plastic material of a synthetic resin and metal nanoparticles, a synthetic resin and inorganic oxide nanoparticles, and inorganic nitride nanoparticles, a composite plastic material of a synthetic resin, a carbon fiber, and a carbon nanotube, a composite plastic material of a synthetic resin, glass flakes, glass fibers, and glass beads, a composite plastic material of a synthetic resin, clay mineral, and particles in a mica derived crystal structure, a laminated plastic material having at least one bond interface between the synthetic resin, the thin glass, and the single organic material, a composite material having barrier characteristics which has at least one 1 or more times of bond interfaces by alternately laminating inorganic layers and organic layers, a stainless steel substrate, a metal multilayer substrate obtained by laminating stainless steel and a different type of metal, an aluminum substrate, or an aluminum substrate with an oxide film having enhanced insulation properties of the surface by performing an oxidation treatment (for example, an anodic oxidation treatment) on the surface. In addition, the resin substrate is preferably a substrate excellent in heat resistance, dimensional stability, solvent resistance, electrical insulation, workability, low gas permeability, low moisture absorption, or the like. The resin substrate may have a gas barrier layer for preventing permeation of moisture or oxygen or an undercoat layer for enhancing flatness of the resin substrate or adhesiveness with a lower electrode, and the like.

In addition, the thickness of the substrate 12 according to the invention is not particularly limited, but is preferably 50 μm to 1,000 μm, and more preferably 50 μm to 500 μm. If the thickness of the substrate 12 is 50 μm or greater, the flatness of the substrate 12 itself is further enhanced. In addition, if the thickness of the substrate 12 is 500 μm or less, the flexibility of the substrate 12 is further enhanced, and the use thereof as a substrate for a flexible device becomes easier.

—Active Layer—

Subsequently, the active layer 14 is mainly formed on the substrate 12, as the transistor.

The active layer 14 uses a semiconductor film. Accordingly, the active layer 14 can be formed by using the method for manufacturing the semiconductor film according to the embodiment of the invention described above.

After the active layer 14 is formed, the corresponding thin film is appropriately patterned according to the device. The patterning can be performed by photolithography and etching. Specifically, a resist pattern is formed by photolithography in a remaining portion, a pattern is formed by performing etching with an acid solution such as a hydrochloric acid, a nitric acid, a dilute sulfuric acid, or a phosphoric acid, or a mixture liquid of a nitric acid and an acetic acid. In addition, a protection film for protecting the active layer 14 at the time of etching of source-drain electrodes may be provided on the active layer 14. The protection film may be formed in a manner of being continued to the active layer 14 or may be formed after the patterning of the active layer 14. Further, the patterning of the active layer may be performed after source-drain electrodes are formed. This is because damages to the active layer 14 due to patterning can be prevented.

As the layer structure of the active layer 14, the active layer 14 may formed with two or more layers, and it is preferable that the active layer 14 is formed with a low resistance layer and a high resistance layer, the low resistance layer comes into contact with the gate insulation film 20, and a high resistance layer electrically comes into contact with at least one of the source electrode 16 and the drain electrode 18.

The thickness of the active layer 14 is not particularly limited, but the thickness is 10 nm to 300 nm and more preferably 50 nm to 100 nm.

—Source-drain Electrode—

A conductive film for forming the source-drain electrodes 16 and 18 is formed on the active layer 14.

As this conductive film, a film having high conductivity is used, and the conductive film can be formed by using, for example, metal such as Al, Mo, Cr, Ta, Ti, Au, and Au or a metal oxide conductive film of Al—Nd, an Ag alloy, tin oxide, zinc oxide, indium tin oxide (ITO), or indium zinc oxide (IZO). As the source-drain electrodes 16 and 18, these conductive films can be used in a single layer structure or a laminate structure of two or more layers.

The forming of the conductive film is formed in a method appropriately selected from a wet method such as a printing method and a coating method, a physical method such as a vacuum evaporation method, a sputtering method, and an ion plating method, and a chemical method such as CVD and a plasma CVD method, by considering suitability with a material used.

If film forming properties, patterning properties by etching or a lift off method, conductivity, and the like are considered, the film thickness of the conductive film to be formed is preferably 10 nm to 1,000 nm and more preferably 50 nm to 500 nm.

Subsequently, the formed conductive film is patterned in a shape determined by etching or a lift off method, such that the source and drain electrodes 16 and 18 are formed. At this point, it is preferable that wiring connected to the source-drain electrodes 16 and 18 is patterned at the same time.

—Gate Insulation Film—

After the source-drain electrodes 16 and 18 and wiring are formed, the gate insulation film 20 is formed.

It is preferable that the gate insulation film 20 has high insulation properties, and may be, for example, an insulation film of $SiO_2$, SiNx, SiON, $Al_2O_3$, $Y_2O_3$, $Ta_2O_5$, and $HfO_2$, or an insulation film including at least two or more of these compounds. The gate insulation film 20 is formed in a method appropriately selected from a wet method such as a printing method and a coating method, a physical method such as a vacuum evaporation method, a sputtering method, and an ion plating method, and a chemical method such as CVD and a plasma CVD method, by considering suitability with a material used.

Subsequently, the gate insulation film 20 is patterned to a predetermined shape by photolithography and etching, if necessary.

In addition, the gate insulation film 20 is required to have a thickness for decreasing a leak electronic current and enhancing voltage resistance but, if the thickness of the gate insulation film is excessively great, a driving voltage increases. The gate insulation film depends on the materials, but the thickness of the gate insulation film is preferably 10 nm to 10 μm, more preferably 50 nm to 1,000 nm, and particularly preferably 100 nm to 400 nm.

—Gate Electrode—

After the gate insulation film 20 is formed, the gate electrode 22 is formed.

The gate electrode 22 can be formed with metal such as Al, Mo, Cr, Ta, Ti, Au, or Au, or a metal oxide conductive film of Al—Nd, an Ag alloy, tin oxide, zinc oxide, indium oxide, indium tin oxide (ITO), or indium zinc oxide (IZO), or the like, by using its high conductivity. As the gate electrode 22, these conductive films can be used in a single layer structure or a laminate structure of two or more layers.

The gate electrode 22 can be formed in a method appropriately selected from a wet method such as a printing method and a coating method, a physical method such as a vacuum evaporation method, a sputtering method, and an ion plating method, and a chemical method such as CVD and a plasma CVD method, by considering suitability with a material used. If film forming properties, patterning properties by etching or a lift off method, conductivity, and the like are considered, the film thickness of the conductive film to be formed is preferably 10 nm to 1,000 nm and more preferably 50 nm to 500 nm.

After the film is formed, the conductive film is patterned in a shape determined by etching or a lift off method, such that the gate electrode 22 is formed. At this point, it is preferable that the gate electrode 22 and gate wiring are patterned at the same time.

In the method described above, as illustrated in FIG. 1A, the TFT 10 having favorable TFT characteristics in that an on-off ratio is high and mobility is also high can be manufactured. In addition, a case where the semiconductor film according to the invention is applied to the active layer 14 is described. However, the semiconductor film according to the invention can be used in the gate insulation film 20, the gate electrode 22, the source electrode 16, or the drain electrode 18, and an active layer in the related art can be used as the active layer 14. In addition, together with forming the active layer 14, the semiconductor film according to the invention can be used in the forming of any one of the gate insulation film 20, the gate electrode 22, the source electrode 16, or the drain electrode 18.

(Application)

The use of the TFT according to the invention described above is not particularly limited, but, for example, the TFT according to the invention is appropriate in a case of being used for a driving element in an electrooptic device, particularly in a large device.

Further, the TFT according to the invention is particularly appropriate for the device that can be manufactured in a low temperature process using a resin substrate (for example, a flexible display), and is very appropriately used as a driving element (driving circuit) in various sensors such as an X ray sensor or various electronic device such as a micro electro mechanical system (MEMS).

EXAMPLES

Hereinafter, examples are described, but the invention is not limited these examples.

<Manufacturing of Semiconductor Film Device>

[Preparing of Oxide Microparticle Dispersion Liquid 1]

First, an In—Sn—O microparticle dispersion liquid in which In—Sn—O microparticles were dispersed in octane was prepared in a method below.

20 mL of octadecene, $In(Ac)_3$ (0.9 mmol), $Sn(Ac)_2$ (0.1 mmol), and a myristic acid (3 mmol) were added to a three-necked flask, and degassing was performed at 110° C. for two hours. Subsequently, substitution was performed with argon in the flask, and heating was performed to 295° C. Subsequently, 1 mL of octadecene in which 3 mmol of oleylamine was dissolved was added to the flask, and the temperature of the flask was maintained at 280° C., and heating was performed for one hour. Thereafter, the temperature of the flask was decreased to 240° C., and heating was further performed for one hour. Ethanol was added to the obtained solution, and particles were precipitated by performing centrifugation. After the supernatant was discarded, the precipitated particles were dispersed in an octane solvent, and concentrating was performed to a desired concentration by using a rotary evaporator.

In this manner, the oxide microparticle dispersion liquid 1 (oxide microparticles: In—Sn—O microparticles, ligand: oleylamine, solvent: octane, and concentration: 50 mg/ml) was prepared.

The average particle diameter of the In—Sn—O microparticles included in the oxide microparticle dispersion liquid 1 was 4 nm.

In addition, the average particle diameter of the oxide microparticles was calculated with an average of ten oxide microparticles by photographic observation in the transmission electron microscope (TEM) measurement. As a measuring device, TITAN80-300 manufactured by FEI.

[Preparing of Oxide Microparticle Dispersion Liquid 2]

First, an $In_2O_3$ microparticle dispersion liquid in which $In_2O_3$ microparticles were dispersed in octane was prepared in a method below.

20 mL of octadecene, In(Ac)$_3$ (1 mmol), and a myristic acid (3 mmol) were added to a three-necked flask, and degassing was performed at 110° C. for two hours. Subsequently, substitution was performed with argon in the flask, and heating was performed to 295° C. Subsequently, 1 mL of octadecene in which 3 mmol of oleylamine was dissolved was added to the flask, and the temperature of the flask was maintained at 280° C., and heating was performed for one hour. Thereafter, the temperature of the flask was decreased to 240° C., and heating was further performed for one hour. Ethanol was added to the obtained solution, and particles were precipitated by performing centrifugation. After the supernatant was discarded, the precipitated particles were dispersed in an octane solvent, and concentrating was performed to a desired concentration by using a rotary evaporator.

In this manner, the oxide microparticle dispersion liquid 2 (oxide microparticles: $In_2O_3$ microparticles, ligand: oleylamine, solvent: octane, concentration: 50 mg/ml) was prepared.

The average particle diameter of the $In_2O_3$ microparticles included in the oxide microparticle dispersion liquid 2 was 5 nm.

[Prepared of Oxide Microparticle Dispersion Liquid 3]

First, an In—Zn—O microparticle dispersion liquid in which In—Zn—O microparticles were dispersed in octane was prepared in the method below.

20 mL of octadecene, In(Ac)$_3$ (0.9 mmol), Zn(Ac)$_2$ (0.1 mmol), a myristic acid (3 mmol) were added to a three-necked flask, and degassing was performed at 110° C. for two hours. Subsequently, substitution was performed with argon in the flask, and heating was performed to 295° C. Subsequently, 1 mL of octadecene in which 3 mmol of oleylamine was dissolved was added to the flask, and the temperature of the flask was maintained at 280° C., and heating was performed for one hour. Thereafter, the temperature of the flask was decreased to 240° C., and heating was further performed for one hour. Ethanol was added to the obtained solution, and particles were precipitated by performing centrifugation. After the supernatant was discarded, the precipitated particles were dispersed in an octane solvent, and concentrating was performed to a desired concentration by using a rotary evaporator.

In this manner, the oxide microparticle dispersion liquid 3 (oxide microparticles: In—Zn—O microparticles, ligand: oleylamine, solvent: octane, concentration: 50 mg/ml) was prepared.

The average particle diameter of the In—Zn—O microparticles included in the oxide microparticle dispersion liquid 3 was 5 nm.

[Preparing of Microparticle Dispersion Liquid 4]

First, a Pb Se microparticle dispersion liquid in which Pb Se microparticles were dispersed in octane was prepared in the method below.

10 mL of octadecene, PbO (1 mmol), and an oleic acid (3 mmol) were added to a three-necked flask, and heating was performed to 150° C. so as to prepare a sufficiently transparent liquid. The preparation of the solution was performed in the nitrogen atmosphere. Subsequently, the solution was heated to 180° C., 3 mL of the octadecene solution in which 3 mmol of trioctylphosphine selenide and 0.15 mmol of diphenylphosphine were dissolved, was added to the solvent. Thereafter, the mixture solution was heated at 160° C. for one hour. Ethanol was added to the manufactured solution, centrifugation was performed, and particles were precipitated, the supernatant was discarded, and the precipitated particles were dispersed again, in the octane solvent. Finally, a concentrating operation was performed by using a rotary evaporator, until the microparticle dispersion liquid had a desired concentration.

In this manner, the microparticle dispersion liquid 4 (microparticles: PbSe microparticles, ligand: an oleic acid, solvent: octane, concentration: 50 mg/ml) was prepared.

The average particle diameter of the PbSe microparticles included in the microparticle dispersion liquid 4 was 7 nm.

[Prepared of Microparticle Dispersion Liquid 5]

First, an InAs microparticle dispersion liquid in which InAs microparticles were dispersed in octane was prepared in the method below.

50 ml of trioctylphosphine, InCl$_3$ (1 mmol), and As[Si(CH$_3$)$_3$]$_3$ were added to a three-necked flask, and heating was performed to 250° C. for two hours. Before the reaction, substitution was performed with nitrogen in the flask. Thereafter, methanol was added to the product, centrifugation was performed, and particles were precipitated. The supernatant was disposed, the precipitated particles were dispersed again, in the octane solvent, so as to obtain the InAs microparticle dispersion liquid. Finally, the microparticle dispersion liquid was subjected to a concentrating operation, by using a rotary evaporator, until the microparticle dispersion liquid had a desired concentration.

In this manner, the microparticle dispersion liquid 5 (microparticles: InAs microparticles, ligand: trioctylphosphine, solvent: octane, concentration: 50 mg/ml) was prepared.

The average particle diameter of the InAs microparticles included in the microparticle dispersion liquid 5 was 4 nm.

[Preparing of Ligand Solution]

1 mmol of a ligand indicated in a "Ligand" section and a "Compound Name" section of Tables 1 and 2 was divided and dissolved in 10 ml of methanol, so as to prepare a ligand solution having a concentration of 0.1 mol/l. In order to promote the dissolving of the ligand in the ligand solution, ultrasonic irradiation was performed, and an unmelted ligand remains as little as possible.

[Substrate]

As the substrate, 1 inch of quartz glass (T-4040 manufactured by Total fine glass) was used.

[Manufacturing of Semiconductor Film]

(1) Oxide Microparticle Aggregate Forming Step

After the oxide microparticle dispersion liquid 1, the oxide microparticle dispersion liquid 2, or the oxide microparticle dispersion liquid 3 which was prepared was dripped to the substrate, and spin coating was performed at 2,500 rpm, so as to obtain an oxide microparticle aggregate film.

(2) Ligand Exchanging Step

Further, the methanol solution (ligand solution) of the ligand presented in Tables 1 and 2 was dripped to the oxide microparticle aggregate film, spin coating was performed at 2,500 rpm, so as to obtain the semiconductor film.

(3) Washing Step 1

Only methanol which is the solvent of the ligand solution was dripped to the semiconductor film, and spin coating was performed.

(4) Washing Step 2

Further, only the octane solvent was dripped to the semiconductor film after washing in the washing step 1, and spin coating was performed.

A semiconductor film having a thickness of about 100 nm which was made of the aggregate of the oxide microparticles and to which ligand exchanging was performed was obtained by repeating two cycles of the series of steps (1) to (4).

As described above, the semiconductor film was manufactured on the substrate.

In the examples and comparative examples, combinations of the oxide microparticle dispersion liquid and the ligand solution are as presented in Tables 1 and 2.

In addition, the types of the ligand included in the ligand solution are ligands indicated in the "Compound" sections of the "Ligand" sections of Tables 1 and 2.

In addition, "A" in the "General Formula" section of the "Ligand" section means that a ligand is expressed by General Formula (A), "B" in the "General Formula" section of the "Ligand" section means that a ligand is expressed by General Formula (B), and "C" in the "General Formula" section of the "Ligand" section means that a ligand is expressed by General Formula (C). A ligand which is not expressed by General Formula (A), (B), and (C) is indicated with "-". In addition, the expression "Number of atoms of A" represents number of atoms of $A^1$, $A^2$, or $A^3$, and the expression "Number of atoms of B" represents number of atoms of $B^1$ or $B^2$.

<Evaluation of Semiconductor Film>

With respect to the obtained semiconductor film, various evaluations were performed.

1. Evaluation of Sheet Resistance

After the manufactured semiconductor film was annealed at 200° C. in the air, and a sheet resistance was measured by using HIRESTA or LORESTA (manufactured by Mitsubishi Chemical Analytech Co., Ltd.). Results thereof are presented in Tables 3 and 4.

2. Evaluation of TFT Characteristics

A semiconductor film having a thickness of 40 nm to which a special ligand exchange treatment was performed in the method described to the respective examples and respective comparative examples except that the concentration of the solution in the step of preparing the oxide microparticle dispersion liquid was adjusted to 10 mg/ml to 20 mg/ml was obtained. Further, the substrate for forming the semiconductor film was a p-Si substrate doped in the high concentration on which a 100 nm of thermal oxide film was formed.

After the semiconductor film was formed, an electrode of Ti 10 nm/Au 40 nm was formed by using the vacuum evaporation method. The electrode was formed by using a shadow mask, so as to manufacture a TFT of L/W=180 μm/1,000 μm.

Transport properties of the TFT were measured by using a semiconductor parameter analyzer (manufactured by Agilent technologies) and sweeping a gate voltage between −40 V to 40 V in a state in which 10 V of a drain voltage was applied, and the field effect mobility was calculated. The results are presented in Tables 3 and 4.

3. Roughness

With respect to the manufactured semiconductor film, a film shape was observed with a sectional SEM image, so as to evaluate the roughness.

—Evaluation Criteria—

A: Unevenness of ±30 nm or less to the average film thickness was seen in a scanning range (10 μm) of SEM B: Unevenness of greater than ±30 nm to the average film thickness was seen in a scanning range (10 μm) of SEM 4. Light Stability With respect to the manufactured TFT, Vg-Id characteristics were evaluated, and irradiation with monochromatic light having a wavelength of 700 nm was performed, such that stability of the TFT characteristics to photoirradiation was evaluated. Each of the TFT was disposed on a stage for characteristic evaluation, dry air was blown for two or more hours, and TFT characteristics were measured in the dry atmosphere. The irradiation strength of the monochromatic light source was set to be 10 μW/cm², Vg-Id characteristics at the time of the non-irradiation with monochromatic light and Vg-Id characteristics at the time of the monochromatic photoirradiation were compared, such that the photoirradiation stability (ΔVth) was evaluated.

In case a threshold shift amount ΔVth to photoirradiation of 700 nm was 1 V or less, an item of the light stability was "A", and in case a threshold shift amount ΔVth was greater than 1 V, an item of the light stability was "B".

Further, the calculation method (that is, measuring of Vg-Id characteristics at the time of the non-irradiation with monochromatic light and Vg-Id characteristics at the time of the monochromatic photoirradiation) of the threshold shift amount ΔVth to the photoirradiation of 700 nm was the same as the evaluation method of the TFT characteristics.

TABLE 1

| | | | Ligand | | | | |
|---|---|---|---|---|---|---|---|
| | | Compound Name | General Formula | $X^1$, $X^2$ | $X^3$, $X^4$ | $X^5$ | $A^1$, $A^2$, $A^3$ |
| Example | 1 | Ethanedithiol | A | SH, SH | — | — | H |
| | 2 | Mercaptopropionic acid | A | SH, COOH | — | — | H |

TABLE 1-continued

| | | Compound Name | General Formula | $X^1$, $X^2$ | $X^3$, $X^4$ | $X^5$ | $A^1$, $A^2$, $A^3$ |
|---|---|---|---|---|---|---|---|
| | 3 | 2-Aminoethanol | A | $NH_2$, OH | — | — | H |
| | 4 | 2-Aminoethane-1-thiol | A | $NH_2$, SH | — | — | H |
| | 5 | 3-Amino-1-propanol | B | — | $NH_2$, OH | — | H |
| | 6 | L-homoserine | B | — | $NH_2$, OH | — | H |
| | 7 | 3-Mercapto-1-propanol | B | — | SH, OH | — | H |
| | 8 | 1-Amino-2-butanol | A | $NH_2$, OH | — | — | $CH_2CH_3$ |
| | 9 | 1-Amino-2-pentanol | A | $NH_2$, OH | — | — | $CH_2CH_2CH_3$ |
| | 10 | Ethylenediamine | A | $NH_2$, $NH_2$ | — | — | H |
| | 11 | Thioglycolic acid | C | — | — | SH | H |
| | 12 | Glycolic acid | C | — | — | OH | H |
| | 13 | Ethylene glycol | A | OH, OH | — | — | H |
| | 14 | Ethanedithiol | A | SH, SH | — | — | H |
| | 15 | 2-Aminoethanol | A | $NH_2$, OH | — | — | H |
| | 16 | 2-Aminoethane-1-thiol | A | $NH_2$, SH | — | — | H |

| | | Ligand | | Oxide microparticle | |
|---|---|---|---|---|---|
| | | Number of atoms of A | $B^1$, $B^2$ | Number of atoms of B | Type | Average particle diameter (nm) |
| Example | 1 | 1 | H | 1 | In—Sn—O | 4 |
| | 2 | 1 | H | 1 | In—Sn—O | 4 |
| | 3 | 1 | H | 1 | In—Sn—O | 4 |
| | 4 | 1 | H | 1 | In—Sn—O | 4 |
| | 5 | 1 | H | 1 | In—Sn—O | 4 |
| | 6 | 1 | COOH | 4 | In—Sn—O | 4 |
| | 7 | 1 | H | 1 | In—Sn—O | 4 |
| | 8 | 7 | H | 1 | In—Sn—O | 4 |
| | 9 | 10 | H | 1 | In—Sn—O | 4 |
| | 10 | 1 | H | 1 | In—Sn—O | 4 |
| | 11 | 1 | H | 1 | In—Sn—O | 4 |
| | 12 | 1 | H | 1 | In—Sn—O | 4 |
| | 13 | 1 | H | 1 | In—Sn—O | 4 |
| | 14 | 1 | H | 1 | $In_2O_3$ | 5 |
| | 15 | 1 | H | 1 | In—ZnO | 5 |
| | 16 | 1 | H | 1 | In—ZnO | 5 |

TABLE 2

| | | Compound Name | General Formula | $X^1$, $X^2$ | $X^3$, $X^4$ | $X^5$ | $A^1$, $A^2$, $A^3$ |
|---|---|---|---|---|---|---|---|
| Comparative Example | 1 | Oleic acid | — | — | — | — | — |
| | 2 | Thiazole | — | — | — | — | — |
| | 3 | Imidazole | — | — | — | — | — |
| | 4 | 1-Amino-2,5-pentanediol | A | $NH_2$, OH | — | — | $(CH_2)_3OH$ |
| | 5 | 1-Propanethiol | B | — | SH, H | — | H |
| | 6 | No dispersant | — | — | — | — | — |
| | 7 | 2-Aminoethanol | A | $NH_2$, OH | — | — | H |
| | 8 | 3-Amino-1-propanol | B | — | $NH_2$, OH | — | H |
| | 9 | Glycolic acid | C | — | — | OH | H |
| | 10 | Ethanedithiol | A | SH, SH | — | — | H |
| | 11 | 2-Aminopropanol | B | — | $NH_2$, OH | — | H |
| | 12 | Glycolic acid | C | — | — | OH | H |

| | | Ligand | | Oxide microparticle | |
|---|---|---|---|---|---|
| | | Number of atoms of A | $B^1$, $B^2$ | Number of atoms of B | Type | Average particle diameter (nm) |
| Comparative Example | 1 | — | — | — | In—Sn—O | 4 |
| | 2 | — | — | — | In—Sn—O | 4 |
| | 3 | — | — | — | In—Sn—O | 4 |
| | 4 | 11 | H | 1 | In—Sn—O | 4 |
| | 5 | 1 | H | 1 | In—Sn—O | 4 |
| | 6 | — | — | — | In—Sn—O | 4 |
| | 7 | 1 | H | 1 | PbSe | 7 |
| | 8 | 1 | H | 1 | PbSe | 7 |
| | 9 | 1 | H | 1 | PbSe | 7 |
| | 10 | 1 | H | 1 | InAs | 4 |
| | 11 | 1 | H | 1 | InAs | 4 |
| | 12 | 1 | H | 1 | InAs | 4 |

TABLE 3

| | | Sheet Resistance (Ω/□) | Mobility (cm²/Vs) | Roughness | Light stability |
|---|---|---|---|---|---|
| Example | 1 | 5.40E+07 | 0.05 | A | A |
| | 2 | 4.80E+07 | 0.06 | A | A |
| | 3 | 8.90E+07 | 0.08 | A | A |
| | 4 | 7.80E+07 | 0.06 | A | A |
| | 5 | 1.20E+08 | 0.05 | A | A |
| | 6 | 1.40E+08 | 0.03 | A | A |
| | 7 | 9.50E+07 | 0.06 | A | A |
| | 8 | 2.10E+08 | 0.02 | A | A |
| | 9 | 2.50E+08 | 0.02 | A | A |
| | 10 | 6.20E+07 | 0.05 | A | A |
| | 11 | 3.40E+07 | 0.05 | A | A |
| | 12 | 4.80E+07 | 0.06 | A | A |
| | 13 | 7.90E+07 | 0.01 | A | A |
| | 14 | 4.30E+07 | 0.08 | A | A |
| | 15 | 3.10E+07 | 0.11 | A | A |
| | 16 | 6.10E+07 | 0.07 | A | A |

TABLE 4

| | | Sheet Resistance (Ω/□) | Mobility (cm²/Vs) | Roughness | Light stability |
|---|---|---|---|---|---|
| Comparative Example | 1 | 3.90E+09 | No movement | A | — |
| | 2 | 3.30E+09 | No movement | A | — |
| | 3 | 2.10E+09 | No movement | A | — |
| | 4 | 1.10E+09 | 0.004 | A | A |
| | 5 | 1.50E+09 | No movement | A | — |
| | 6 | 1.67E+05 | No field effect | B | — |
| | 7 | 3.20E+10 | No movement | A | — |
| | 8 | 4.60E+10 | No movement | A | — |
| | 9 | 1.90E+10 | No movement | A | — |
| | 10 | 8.60E+09 | 0.0009 | A | B |
| | 11 | 1.20E+10 | 0.0001 | A | B |
| | 12 | 7.60E+09 | 0.0004 | A | B |

As presented in Tables 1 to 4, with respect to a semiconductor film in which an oleic acid which is a general dispersant was coordinated, it was found that high electroconductivity characteristics and high TFT mobility were able to be obtained by modifying the special ligand.

In addition, when the same evaluation was performed by using different InSnO particles in which a dispersant is not coordinated, unevenness of the film was extremely remarkable, and a sufficient field effect was not observed at the time of TFT evaluation.

In ethanedithiol (Example 1) and 1-propanethiol (Comparative Example 5) which have the same mercapto group and both of which have relatively low molecular weights, sufficient electroconductivity was not seen. This is because particles were not able to be sufficiently come close to each other, since 1-propanethiol have one coordinating group, and thus the coordinating force to the particle surface was not sufficient, or crosslinking coordination between particles was not able to be performed. Accordingly, it was found that high semiconductor characteristics are exhibited by coordinating a low molecular ligand (ligand) including two or more ligands in a structure, as expressed by the general formulae according to the invention.

What is claimed is:

1. A semiconductor film, comprising:
an aggregate of oxide microparticles including at least one type of metal selected from the group consisting of In, Zn, and Sn; and
at least one type of a ligand which is selected from the group consisting of a ligand expressed by General Formula (A) below, a ligand expressed by General Formula (B) below, and a ligand expressed by General Formula (C) below and which is coordinated with the oxide microparticles,

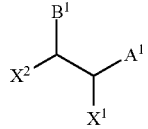

General Formula (A)

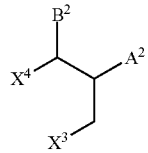

General Formula (B)

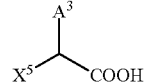

General Formula (C)

wherein, in General Formula (A), each of $X^1$ and $X^2$ independently represents —SH, —NH$_2$, —OH, or —COOH, and each of $A^1$ and $B^1$ independently represents a hydrogen atom or a substituent having from 1 to 10 atoms,
in General Formula (B), each of $X^3$ and $X^4$ independently represents —SH, —NH$_2$, —OH, or —COOH and each of $A^2$ and $B^2$ independently represents a hydrogen atom or a substituent having from 1 to 10 atoms, and
in General Formula (C), $X^5$ represents —SH, —NH$_2$, or —OH, and $A^3$ represents a hydrogen atom or a substituent having from 1 to 10 atoms,
wherein the oxide microparticles include at least In, and
wherein the at least one type of the ligand is not ethylenediamine, 2-aminoethanol, or ethylene glycol.

2. A thin film transistor comprising:
the semiconductor film according to claim 1.

3. The semiconductor film according to claim 1,
wherein an average particle diameter of the oxide microparticles is 3 nm to 30 nm.

4. The semiconductor film according to claim 1,
wherein, in General Formula (A), each of $A^1$ and $B^1$ represents a hydrogen atom,
in General Formula (B), each of $A^2$ and $B^2$ represents a hydrogen atom, and
in General Formula (C), $A^3$ represents a hydrogen atom.

5. The semiconductor film according to claim 1,
wherein, in General Formula (A), $X^2$ represents —SH or —NH$_2$, and
in General Formula (B), $X^4$ represents —SH or —NH$_2$.

6. The semiconductor film according to claim 1,
wherein the at least one type of the ligand is selected from the group consisting of ethanedithiol, mercaptopropionic acid, glycolic acid, 2-aminoethanethiol, 3 amino-1-propanol, 3-mercapto-1-propanol, and thioglycolic acid, and derivatives of the ligands.

7. An oxide microparticle dispersion liquid comprising:
oxide microparticles including at least one type of metal selected from the group consisting of In, Zn, and Sn;
at least one type of a ligand which is selected from the group consisting of a ligand expressed by General Formula (A) below, a ligand expressed by General Formula (B) below, and a ligand expressed by General Formula (C) below and which is coordinated with the oxide microparticles; and an organic solvent,

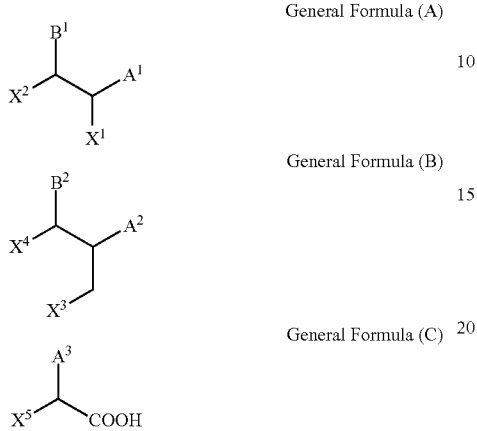

General Formula (A)

General Formula (B)

General Formula (C)

wherein in General Formula (A), each of $X^1$ and $X^2$ independently represents —SH, —NH$_2$, —OH, or —COOH, and each of $A^1$ and $B^1$ independently represents a hydrogen atom or a substituent having from 1 to 10 atoms, in General Formula (B), each of $X^3$ and $X^4$ independently represents —SH, —NH$_2$, —OH, or —COOH and each of $A^2$ and $B^2$ independently represents a hydrogen atom or a substituent having from 1 to 10 atoms, and in General Formula (C), $X^5$ represents —SH, —NH$_2$, or —OH, and $A^3$ represents a hydrogen atom or a substituent having from 1 to 10 atoms, wherein the oxide microparticles include at least In, and wherein the at least one type of the ligand is not ethylenediamine, 2-aminoethanol, or ethylene glycol.

8. The oxide microparticle dispersion liquid according to claim 7, wherein an average particle diameter of the oxide microparticles is 3 nm to 30 nm.

9. The oxide microparticle dispersion liquid according to claim 7, wherein, in General Formula (A), each of $A^1$ and $B^1$ represents a hydrogen atom, in General Formula (B), each of $A^2$ and $B^2$ represents a hydrogen atom, and in General Formula (C), $A^3$ represents a hydrogen atom.

10. The oxide microparticle dispersion liquid according to claim 7, wherein, in General Formula (A), $X^2$ represents —SH or —NH$_2$, and in General Formula (B), $X^4$ represents —SH or —NH$_2$.

11. The oxide microparticle dispersion liquid according to claim 7, wherein the at least one type of the ligand is selected from the group consisting of ethanedithiol, mercaptopropionic acid, glycolic acid, 2-aminoethanethiol, 3 amino-1-propanol, 3-mercapto-1-propanol, and thioglycolic acid, and derivatives of the ligands.

12. A method for manufacturing a semiconductor film, comprising:

an oxide microparticle aggregate forming step of applying an oxide microparticle dispersion liquid containing oxide microparticles including at least one type of metal which is selected from the group consisting of In, Zn, and Sn, a first ligand coordinated with the oxide microparticles, and a first solvent, to a substrate so as to form an aggregate of the oxide microparticles; and a ligand exchanging step of applying a solution containing a second ligand which has a shorter molecular chain length than the first ligand and which is at least one type selected from the group consisting of a ligand expressed by General Formula (A) below, a ligand expressed by General Formula (B) below, and a ligand expressed by General Formula (C) below, and a second solvent, to an aggregate of the oxide microparticles so as to exchange the first ligand coordinated with the oxide microparticles into the second ligand,

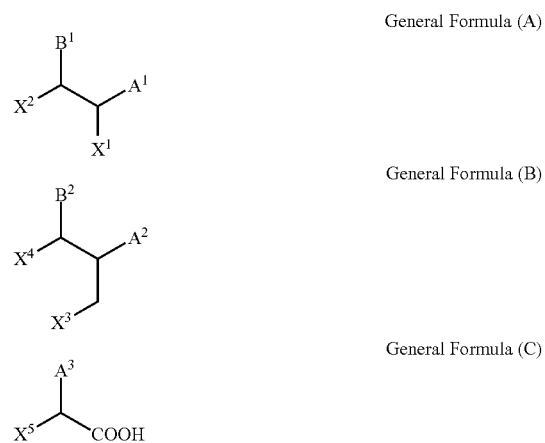

General Formula (A)

General Formula (B)

General Formula (C)

wherein in General Formula (A), each of $X^1$ and $X^2$ independently represents —SH, —NH$_2$, —OH, or —COOH, and each of $A^1$ and $B^1$ independently represents a hydrogen atom or a substituent having from 1 to 10 atoms, in General Formula (B), each of $X^3$ and $X^4$ independently represents —SH, —NH$_2$, —OH, or —COOH and each of $A^2$ and $B^2$ independently represents a hydrogen atom or a substituent having from 1 to 10 atoms, and in General Formula (C), $X^5$ represents —SH, —NH$_2$, or —OH, and $A^3$ represents a hydrogen atom or a substituent having from 1 to 10 atoms.

13. The method for manufacturing a semiconductor film according to claim 12, wherein the oxide microparticles include at least In.

14. The method for manufacturing a semiconductor film according to claim 12, wherein an average particle diameter of the oxide microparticles is 3 nm to 30 nm.

15. The method for manufacturing a semiconductor film according to claim 12, wherein, in General Formula (A), each of $A^1$ and $B^1$ represents a hydrogen atom, in General Formula (B), each of $A^2$ and $B^2$ represents a hydrogen atom, and in General Formula (C), $A^3$ represents a hydrogen atom.

16. The method for manufacturing a semiconductor film according to claim 12, wherein, in General Formula (A), $X^2$ represents —SH or —NH$_2$, and in General Formula (B), $X^4$ represents —SH or —NH$_2$.

17. The method for manufacturing a semiconductor film according to claim 12,
wherein the at least one type of the ligand is selected from the group consisting of ethanedithiol, ethylenediamine, mercaptopropionic acid, glycolic acid, 2-aminoethanethiol, 2-aminoethanol, 3-amino-1-propanol, 3-mercapto-1-propanol, and thioglycolic acid, and derivatives of the ligands.

* * * * *